US011018643B2

(12) United States Patent
Jingu

(10) Patent No.: US 11,018,643 B2
(45) Date of Patent: May 25, 2021

(54) SIGNAL AMPLIFIER DEVICE

(71) Applicant: SONY SEMICONDUCTOR SOLUTIONS CORPORATION, Kanagawa (JP)

(72) Inventor: Yoshikatsu Jingu, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/322,785

(22) PCT Filed: Jun. 20, 2017

(86) PCT No.: PCT/JP2017/022641
§ 371 (c)(1),
(2) Date: Feb. 1, 2019

(87) PCT Pub. No.: WO2018/037688
PCT Pub. Date: Mar. 1, 2018

(65) Prior Publication Data
US 2019/0199308 A1 Jun. 27, 2019

(30) Foreign Application Priority Data
Aug. 23, 2016 (JP) .............................. JP2016-162590

(51) Int. Cl.
*H03G 3/00* (2006.01)
*H03G 3/30* (2006.01)
(Continued)

(52) U.S. Cl.
CPC ............. *H03G 3/30* (2013.01); *H03F 1/0283* (2013.01); *H03F 1/086* (2013.01); *H03F 1/12* (2013.01);
(Continued)

(58) Field of Classification Search
CPC .. H03G 3/30; H03G 1/0029; H03G 2201/506; H03G 2201/40; H03F 3/211;
(Continued)

(56) References Cited

U.S. PATENT DOCUMENTS 5,548,246 A * 8/1996 Yamamoto ............ H03F 1/0277
330/277
7,649,418 B2 * 1/2010 Matsui ................ H03F 3/45188
330/254
(Continued)

FOREIGN PATENT DOCUMENTS

CN 1682439 A 10/2005
EP 1435693 A1 7/2004
(Continued)

OTHER PUBLICATIONS

International Search Report and Written Opinion of PCT Application No. PCT/JP2017/022641, dated Sep. 12, 2017, 09 pages of ISRWO.

(Continued)

*Primary Examiner* — Khanh V Nguyen
*Assistant Examiner* — Khiem D Nguyen
(74) *Attorney, Agent, or Firm* — Chip Law Group

(57) ABSTRACT

A signal amplifier device is provided to ensure the continuity of the gain of an amplifier. The signal amplifier device includes a main path and a sub path connected in parallel to the main path. A main path first amplifier circuit amplifies an input signal on the main path. A main path second amplifier circuit includes a common-gate transistor connected in series with an output of the main path first amplifier circuit without sharing a DC current. On the main sub path, the sub path amplifier circuit amplifies the input signal by using a gain lower than the maximum gain in the main path.

9 Claims, 8 Drawing Sheets

(51) Int. Cl.
*H03F 1/02* (2006.01)
*H03G 1/00* (2006.01)
*H03F 3/21* (2006.01)
*H03F 1/08* (2006.01)
*H03F 1/12* (2006.01)
*H03F 3/347* (2006.01)
*H03F 3/68* (2006.01)

(52) U.S. Cl.
CPC ............. *H03F 3/211* (2013.01); *H03F 3/347* (2013.01); *H03F 3/68* (2013.01); *H03G 1/0029* (2013.01); *H03F 2200/129* (2013.01); *H03F 2200/72* (2013.01); *H03G 2201/40* (2013.01); *H03G 2201/506* (2013.01)

(58) Field of Classification Search
CPC .......... H03F 1/0283; H03F 3/68; H03F 3/347; H03F 1/12; H03F 1/086; H03F 2200/72; H03F 2200/129
USPC .............................. 330/284, 295, 124 R, 277
See application file for complete search history.

(56) References Cited

U.S. PATENT DOCUMENTS

| | | |
|---|---|---|
| 2004/0246760 A1 | 12/2004 | Hirabayashi et al. |
| 2006/0033575 A1 | 2/2006 | Ooya et al. |
| 2007/0296501 A1 | 12/2007 | Matsui |
| 2010/0315166 A1 | 12/2010 | Kamimura et al. |
| 2011/0221531 A1 | 9/2011 | Kim et al. |

FOREIGN PATENT DOCUMENTS

| | | |
|---|---|---|
| JP | 2003-163550 A | 6/2003 |
| JP | 2004-112299 A | 4/2004 |
| JP | 2007-335942 A | 12/2007 |
| JP | 2010-082235 A | 4/2010 |
| JP | 2010-213141 A | 9/2010 |
| JP | 2010-288007 A | 12/2010 |
| JP | 2012-023649 A | 2/2012 |
| KR | 10-2005-0057321 A | 6/2005 |
| WO | 03/034593 A1 | 4/2003 |
| WO | 2004/027988 A1 | 4/2004 |
| WO | 2008/114311 A1 | 9/2008 |
| WO | 2010/082235 A1 | 7/2010 |

OTHER PUBLICATIONS

Office Action for JP Patent Application No. 2018-535483 dated Nov. 4, 2020, 04 pages of Office Action and 04 pages of English Translation.

* cited by examiner

SIGNAL AMPLIFIER DEVICE

CROSS REFERENCE TO RELATED APPLICATIONS

This application is a U.S. National Phase of International Patent Application No. PCT/JP2017/022641 filed on Jun. 20, 2017, which claims priority benefit of Japanese Patent Application No. JP 2016-162590 filed in the Japan Patent Office on Aug. 23, 2016. Each of the above-referenced applications is hereby incorporated herein by reference in its entirety.

TECHNICAL FIELD

The present technology relates to a signal amplifier device. The present technology relates more particularly to a signal amplifier device that variably controls the gain in accordance with the signal strength of an input signal.

BACKGROUND ART

A signal amplifier device used in wireless communication and broadcast reception needs to perform amplifying operation using an appropriate gain according to the signal strength of the received signal in order to maintain the output signal power within a certain range. That is, high gain and low noise characteristics are required for a signal with low signal strength, while low gain and high linearity are required to suppress occurrence of distortion for a signal with high signal strength. Therefore, a variable gain amplifier to change the gain with different paths has been proposed (refer to Patent Documents 1 and 2, for example).

CITATION LIST

Patent Document

Patent Document 1: Japanese Patent Application Laid-Open No. 2010-213141
Patent Document 2: Japanese Patent Application Laid-Open No. 2012-023649

SUMMARY OF THE INVENTION

Problems to be Solved by the Invention

In the above-described known technique, the gain switching is performed by switching between a high gain mode using an amplification path alone and a high linearity mode using a bypass path alone. In the above-described known technique, however, bypass path operation would cause short-circuit in the input/output terminals of the amplification path. This makes it difficult to operate the two paths at the same time, leading to operation of one of the paths alone. In addition, in the above-described known technique, an input signal is inverted in the amplification path while an input signal undergoes noninverting output in the bypass path, leading to signal cancellation occurring in principle at an output composite point. These situations make it difficult to smoothly and continuously switch output signal components from the amplification path signal to the bypass path signal.

The present technology has been developed in view of such a situation, and aims to ensure continuity of the gain of the amplifier.

Solutions to Problems

The present technology is made to solve the above problem and a first aspect of the present technology is a signal amplifier device including: a main path first amplifier circuit that amplifies an input signal on a main path; a main path second amplifier circuit including a common-gate transistor connected in series to an output of the main path first amplifier circuit without sharing a DC current; and a sub path amplifier circuit that amplifies, on a sub path connected in parallel to the main path, the input signal by using a gain lower than a maximum gain on the main path. This achieves an effect that it is possible to control the gain by continuously switching the path suitable for the signal strength out of the main path and the sub path without causing a steep change.

Furthermore, it is preferable in the first aspect that phases of output voltages are the same in the main path first amplifier circuit, the main path second amplifier circuit, and the sub path amplifier circuit. This achieves an effect of facilitating the composition of the gain characteristics of these amplifier circuits.

Furthermore, in the first aspect, the main path second amplifier circuit may arrange a bias element that supplies a DC current to be connected to each of a source and a drain. Furthermore, in this case, the main path second amplifier circuit may further include a shunt transistor connected in parallel with the common-gate transistor so as to shunt a current, and the bias element on the source side of the common-gate transistor may be a constant current source. This achieves an effect of increasing the impedance of the bias element and improving the noise performance.

Furthermore, in the first aspect, the main path second amplifier circuit may change the gate voltage of the common-gate transistor to control mutual conductance so as to perform gain control and signal interruption. Furthermore, the main path first amplifier circuit may allow another transistor to be inserted to the source to control a gate voltage of the other transistor to control a resistance value of the other transistor so as to perform the gain control. Furthermore, the sub path amplifier circuit may allow another transistor to be inserted to the source to control a gate voltage of the other transistor to control a resistance value of the other transistor so as to perform the gain control.

Furthermore, in the first aspect, the signal amplifier device may further include a gain control bias circuit that is driven by a single variable power supply to perform gain control for each of the main path first amplifier circuit, the main path second amplifier circuit, and the sub path amplifier circuit. This achieves an effect that the gain of each of the amplifier circuits can be controlled by a single variable power supply.

Furthermore, in the first aspect, the sub path may further include an attenuator for attenuating a signal input to the sub path amplifier circuit. This achieves an effect that stable amplification without distortion can be performed even for strong signals.

Furthermore, in the first aspect, the signal amplifier device may further include a replica circuit having the same configuration as the configuration of the main path second amplifier circuit so as to share the gate voltage; and an operational amplifier that provides feedback to the main path first amplifier circuit so as to achieve match in voltages of corresponding individual components between the main path second amplifier circuit and the replica circuit. This achieves an effect that the main path first amplifier circuit and the main path second amplifier circuit can be connected in series with each other without sharing the DC current.

Effects of the Invention

According to the present technology, it is possible to achieve an excellent effect that the continuity of the gain of the amplifier is ensured. Note that effects described herein are non-restricting. The effects may be any of effects described in the present disclosure.

MODES FOR CARRYING OUT THE INVENTION

Hereinafter, embodiments of the present technology (hereinafter, embodiment(s)) will be described. The description will be given in the following order.

1. First embodiment (example in which a common-gate amplifier circuit is provided as an output circuit of a main path)
2. Second embodiment (example in which a shunt transistor is added to the output circuit of the main path)
3. Third embodiment (example in which a replica circuit is added to the output circuit of the main path)
4. Modification (example in which a plurality of main paths is provided)

1. First Embodiment

Overview of Signal Amplifier Device

Figure 1:
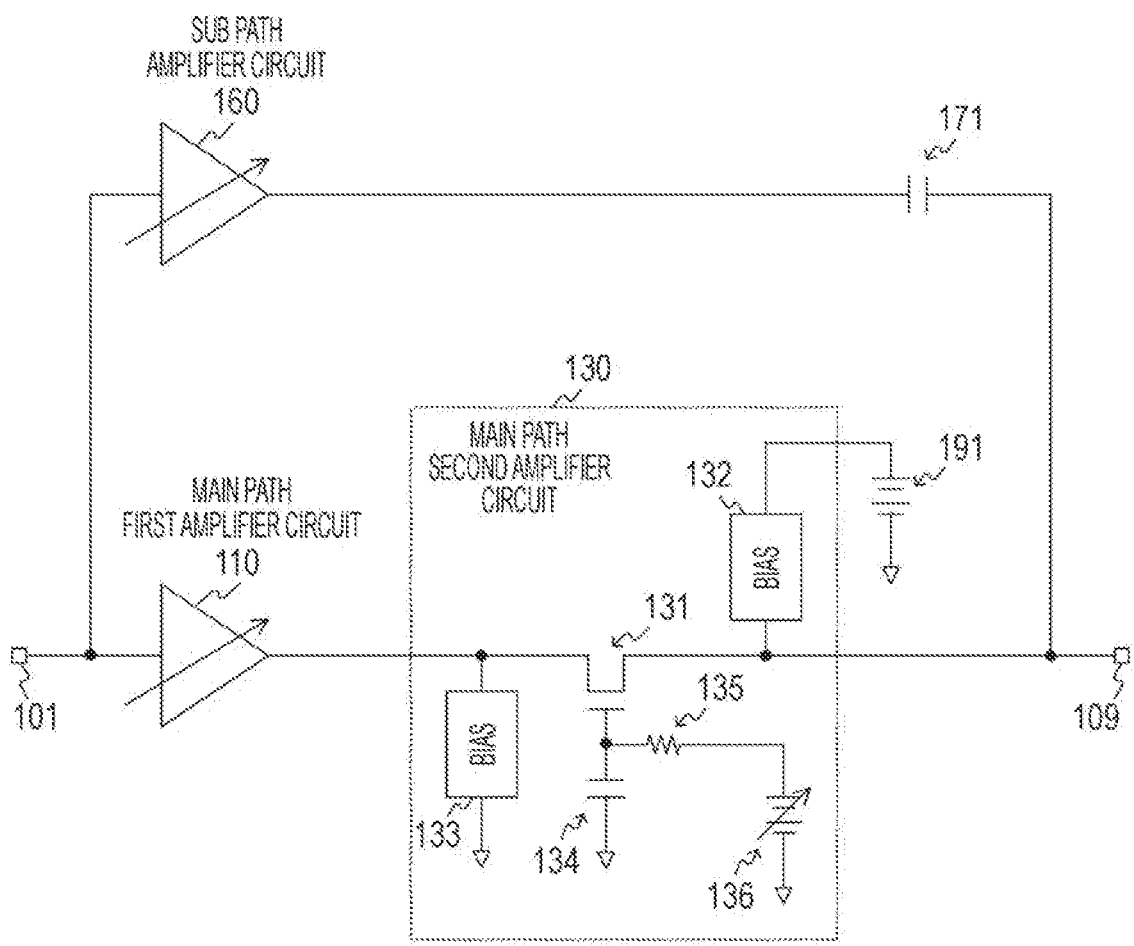
FIG. 1 is a diagram illustrating a schematic example of a signal amplifier device in an embodiment of the present technology.

FIG. 1 is a diagram illustrating a schematic example of a signal amplifier device in an embodiment of the present technology. The signal amplifier device includes an input terminal 101 to which a signal is input and an output terminal 109 that outputs an amplified signal. A plurality of paths is connected in parallel between the input terminal 101 and the output terminal 109. A path having the lowest maximum gain is defined as a sub path, and the other path is referred to as a main path. In this example, there is one main path.

On the main path, a main path first amplifier circuit 110 and a main path second amplifier circuit 130 connected in series. The main path first amplifier circuit 110 is an amplifier circuit that amplifies a signal input to the input terminal 101. The main path second amplifier circuit 130 is an amplifier circuit including a common-gate transistor 131 connected in series to the output of the main path first amplifier circuit 110. The common-gate transistor 131 is connected to a bias element 132 on the side of a power supply 191 and a bias element 133 on the side of the ground. The gate of the common-gate transistor 131 is grounded via a capacitor 134. Furthermore, the gate of the common-gate transistor 131 is connected to a variable power supply 136 via a resistor 135 so as to perform gain control and signal interruption.

A sub path amplifier circuit 160 is connected onto the sub path. The sub path amplifier circuit 160 is an amplifier circuit that amplifies a signal input to the input terminal 101 with a gain lower than the maximum gain in the main path. The output of the sub path amplifier circuit 160 is connected to the output terminal 109 via a capacitor 171.

Circuit Configuration

Figure 2:
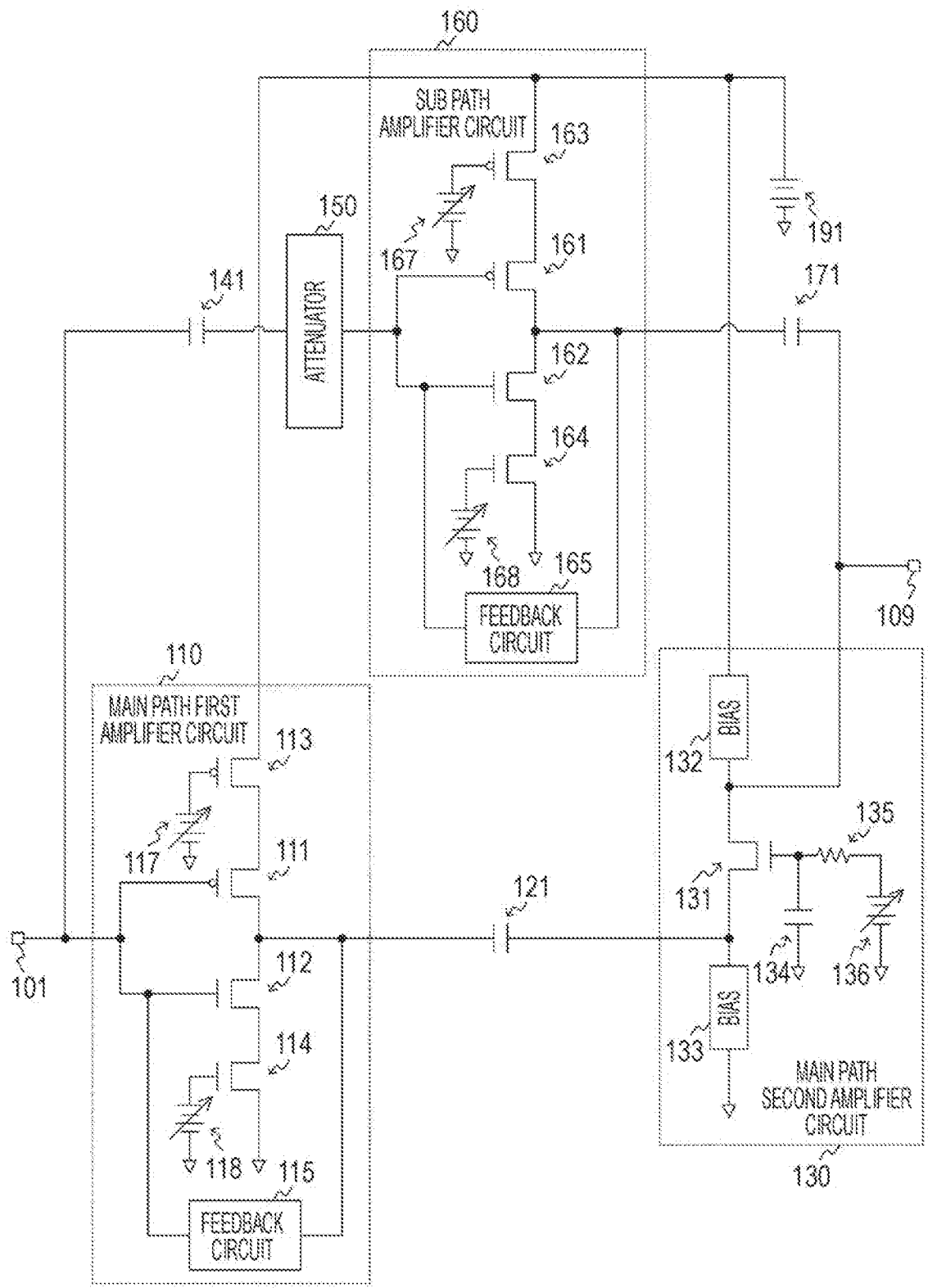
FIG. 2 is a diagram illustrating a circuit example of a signal amplifier device according to a first embodiment of the present technology.

FIG. 2 is a diagram illustrating a circuit example of a signal amplifier device according to the first embodiment of the present technology. In this signal amplifier device, the main path and the sub path are connected in parallel between the input terminal 101 and the output terminal 109 similarly to the above-described schematic example.

On the main path, the main path first amplifier circuit 110 and the main path second amplifier circuit 130 are connected in series via a capacitor 121. The capacitor 121 is provided to connect the main path first amplifier circuit 110 and the main path second amplifier circuit 130 in AC connection so as to prevent a DC current from being shared between the main path first amplifier circuit 110 and the main path second amplifier circuit 130. By not sharing the DC current between the two, it is possible to achieve optimal bias design, leading to reduction of power consumption. In addition, since there is no need to supply an unnecessary bias current, it is possible to minimize the size of the transistor, making it possible to prevent degradation of radio frequency characteristics due to parasitic capacitance. Moreover, the gain control of the main path first amplifier circuit 110 and the main path second amplifier circuit 130 can be performed independently, making it possible to facilitate implementation of the gain control.

The main path first amplifier circuit 110 includes a common-source amplifier circuit with the drains of a P-type transistor 111 and an N-type transistor 112 connected and the source grounded. The inputs of the common-source amplifier circuit are the gates of the P-type transistor 111 and the N-type transistor 112, and both are connected to the input terminal 101. The output of this common-source amplifier circuit is fed back to the gate input via a feedback circuit 115.

Another P-type transistor 113 is connected to the source of the P-type transistor 111, while another N-type transistor 114 is connected to the source of the N-type transistor 112. Variable power supplies 117 and 118 are connected to the gates of the P-type transistor 113 and the N-type transistor 114, respectively. The variable power supplies 117 and 118 can be used to control the resistance value of the transistor, enabling execution of the gain control of the main path first amplifier circuit 110.

As described above, the main path second amplifier circuit 130 includes the common-gate transistor 131, the bias elements 132 and 133, the capacitor 134, the resistor 135, and the variable power supply 136. The common-gate transistor 131 changes the gate voltage by using the variable power supply 136 to control the mutual conductance, making it possible to perform gain control and signal interruption. The bias elements 132 and 133 are optional elements that can supply a DC current, and an example of these include a resistor, a transistor, and an inductor.

The sub path amplifier circuit 160 is connected onto the sub path. A capacitor 141 is connected between the input terminal 101 and the sub path amplifier circuit 160, while a capacitor 171 is connected between the output terminal 109 and the sub path amplifier circuit 160. With this configuration, the sub path is connected to the input terminal 101 and the output terminal 109 in AC connection.

An attenuator 150 is connected to the input of the sub path amplifier circuit 160. The attenuator 150 is an attenuator for reducing the excessive strength of a signal. Since the sub path has a maximum gain lower than the maximum gain in the main path and thus it is a path used in a case where the signal strength is high, the attenuator 150 is provided in order to achieve amplification on a strong signal with higher stability. Note that the attenuator 150 can be omitted in a case where the sub path amplifier circuit 160 has a characteristic resistant to distortion.

The sub path amplifier circuit 160 includes a common-source amplifier circuit with the drains of the P-type transistor 161 and the N-type transistor 162 connected and the source grounded. The inputs of the common-source amplifier circuit are the gates of the P-type transistor 161 and the N-type transistor 162, and are connected to the output of the attenuator 150 in this example. The output of the common-source amplifier circuit is fed back to the gate input via a feedback circuit 165.

Another P-type transistor 163 is connected to the source of the P-type transistor 161, while another N-type transistor 164 is connected to the source of the N-type transistor 162. Variable power supplies 167 and 168 are connected to the gates of the P-type transistor 163 and the N-type transistor 164, respectively. The variable power supplies 167 and 168 can be used to control the resistance value of the transistor, enabling execution of the gain control of the sub path amplifier circuit 160.

Basically, while the sub path amplifier circuit 160 has a configuration similar to the main path first amplifier circuit 110, the gain characteristic and other characteristics of the sub path can be designed independently of the main path. For example, in a case where the main path is designed with high maximum gain and priority to noise performance at small signal input, the noise performance requirement for the sub path would be reduced. This enables design of the sub path to be specialized in complementing the main path performance. At this time, the sub path amplifies the intense electric field signal as a low gain path, for example. In this manner, the sub path can be designed independently of the main path as an amplifier with high linearity even with an input of an intense electric field signal.

Note that a power supply 191 is provided to the main path first amplifier circuit 110, the main path second amplifier circuit 130, and the sub path amplifier circuit 160.

Gain Control

Figure 3:
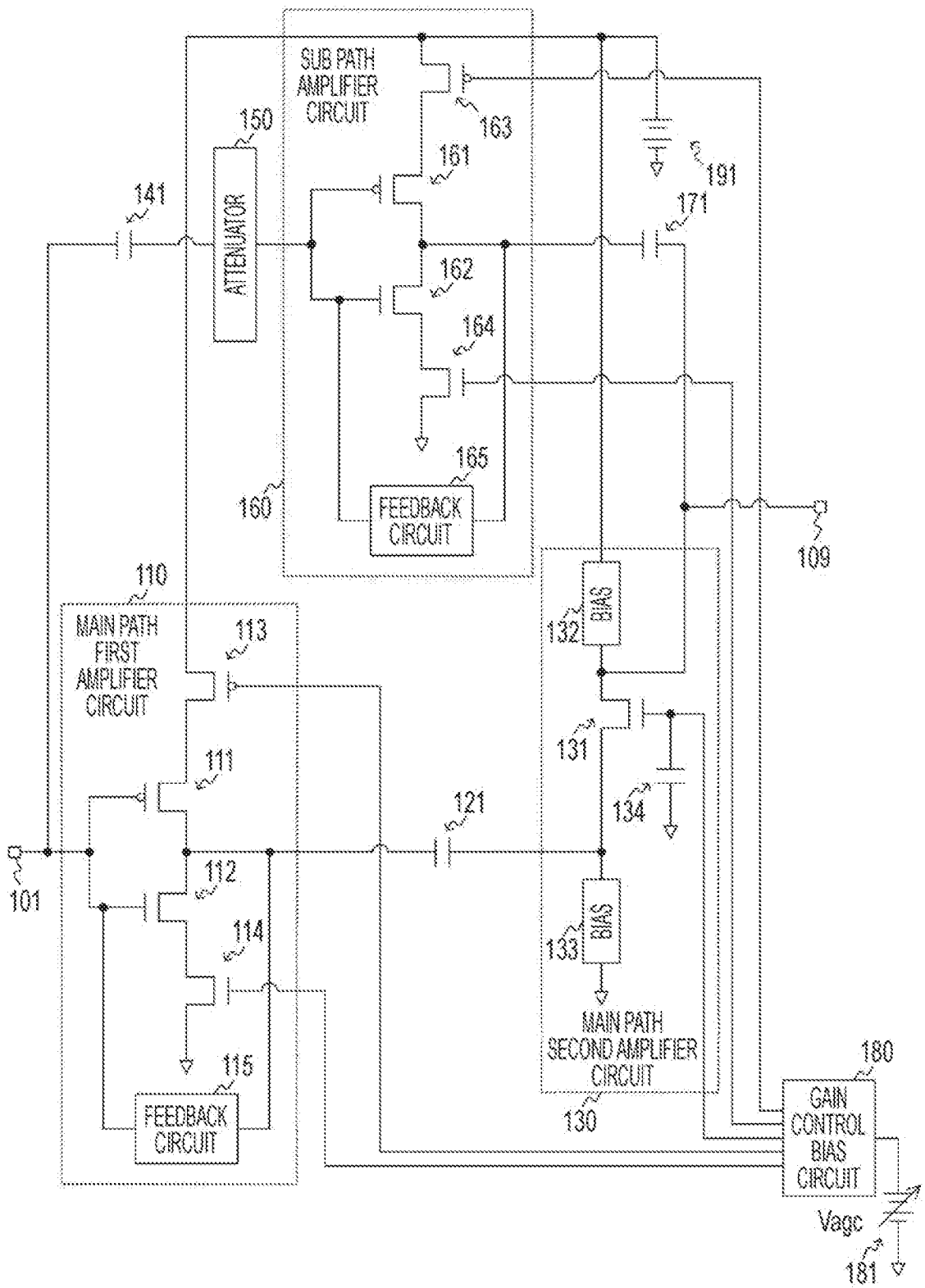
FIG. 3 is a diagram illustrating an example of implementation of gain control in an embodiment of the present technology.

FIG. 3 is a diagram illustrating an example of implementation of gain control in an embodiment of the present technology. The circuit example described above assumes separate variable power supplies are respectively connected to the main path first amplifier circuit 110, the main path second amplifier circuit 130, and the sub path amplifier circuit 160, and then, the voltage of each of the variable power supplies is changed to perform the gain control. In contrast, this example of gain control includes a gain control bias circuit 180 driven by the single variable power supply 181.

The voltage from the gain control bias circuit 180 is supplied to the gates of the P-type transistor 113, the N-type transistor 114, the common-gate transistor 131, the P-type transistor 163 and the N-type transistor 164. The gain control bias circuit 180 supplies a variable voltage to each of the main path first amplifier circuit 110, the main path second amplifier circuit 130, and the sub path amplifier circuit 160 in accordance with the change in the voltage of the variable power supply 181 so as to control the gain.

Figure 4:
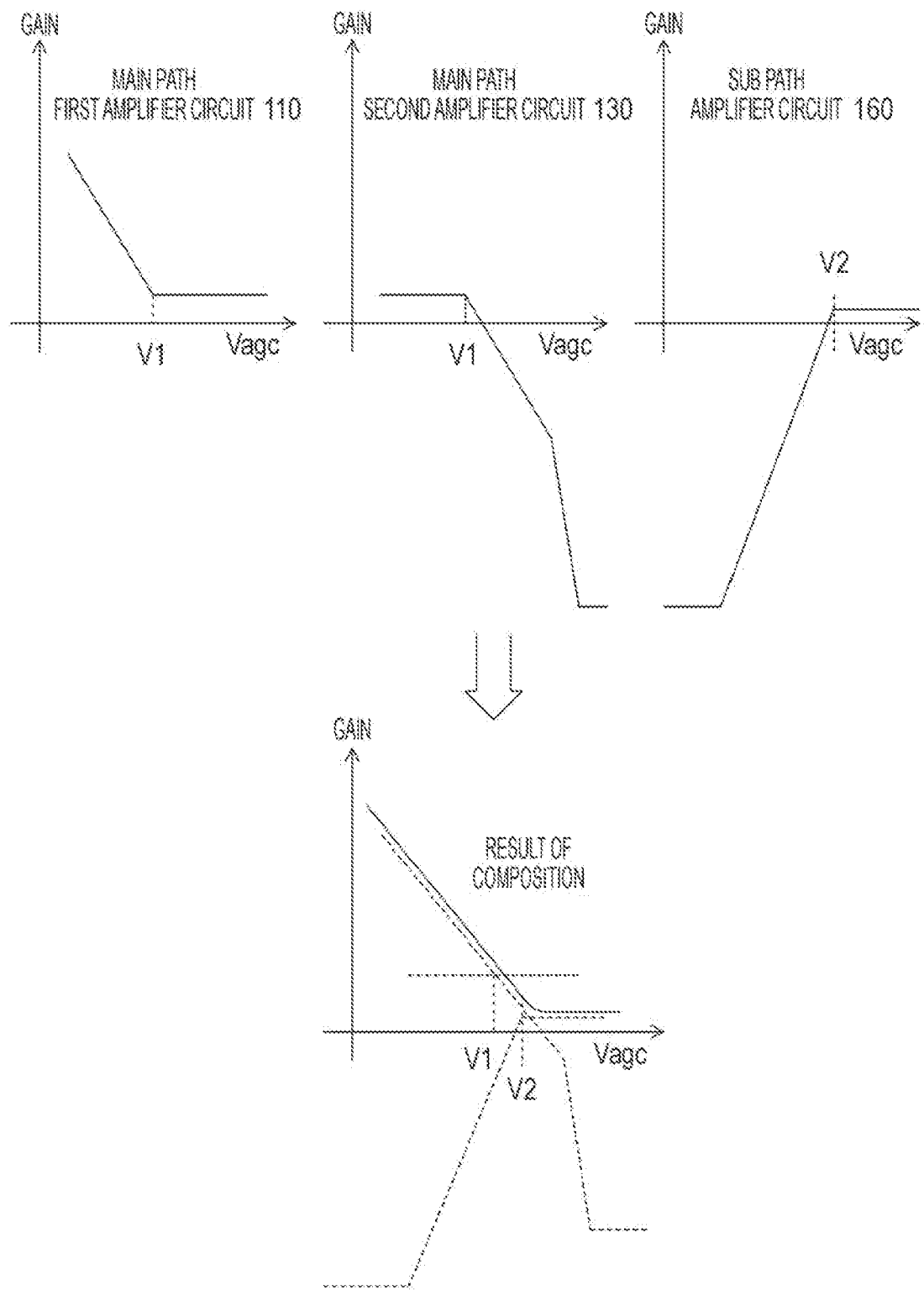
FIG. 4 is a diagram illustrating an example of a relationship between a variable power supply 181 used for gain control and gain control in an embodiment of the present technology.

FIG. 4 is a diagram illustrating an example of a relationship between a variable power supply 181 used for gain control and gain control in an embodiment of the present technology. Here, correlations between voltage Vagc of the variable power supply 181 and the gain in each of the amplifier circuits are illustrated.

As illustrated in the upper graph of the figure, when the voltage Vagc of the variable power supply 181 is lower than a predetermined voltage V1, the gain of the main path first amplifier circuit 110 monotonously decreases in accordance with the voltage Vagc, and then, the gain indicates a constant value after the voltage exceeds the predetermined voltage V1. Furthermore, in the main path second amplifier circuit 130, the gain is constant when the voltage Vagc of the variable power supply 181 is lower than the predetermined voltage V1, and then, the gain monotonously decreases after the voltage exceeds the predetermined voltage V1. Furthermore, when the voltage Vagc of the variable power supply 181 is lower than a predetermined voltage V2, the gain of the sub path amplifier circuit 160 monotonously increases in accordance with the voltage Vagc, and then, the gain indicates a constant value after the voltage exceeds the predetermined voltage V2.

It is assumed that the phases of the output voltages of the main path first amplifier circuit 110, the main path second amplifier circuit 130, and the sub path amplifier circuit 160 are the same. If amplifier circuits in which the phases of the output voltages are inverted are connected in parallel, output cancellation might be induced, leading to an abrupt drop of the output voltage. In the first embodiment of the present technology, the phases of the output voltages of the individual amplifier circuits are assumed to be the same, enabling composition of the gain characteristics of the individual amplifier circuits by addition. The result of composition is as illustrated in the lower graph of FIG. 4. That is, when the voltage Vagc of the variable power supply 181 is lower than the predetermined voltage V2, the gain monotonously decreases in accordance with the voltage Vagc, and the gain becomes constant at a low level after the voltage Vagc exceeds the predetermined voltage V2. With this configuration, it is possible to continuously switch the amplification paths in the signal amplifier device to continuously control the gain of the signal amplifier device without a steep change.

In this manner, according to the first embodiment of the present technology, it is possible to control the gain without a steep change by continuously switching the path suitable for the signal strength out of the main path and the sub path. In other words, it is possible to improve the convergence of the control of ensuring the continuity of the gain in the gain control as well as maintaining the output signal within a certain range. With the common-gate transistor 131 connected to the output of the main path, it is possible to achieve a role of gain control and signal interruption, being advantageous in terms of signal loss compared to a case of providing a separate switch for signal interruption.

2. Second Embodiment

The above-described first embodiment assumes that an optional bias element 133 is provided on the ground side of the common-gate transistor 131. When the bias element 133 has high impedance, the signal loss can be reduced, leading to improvement of the noise performance. Therefore, the second embodiment assumes that a constant current source having high impedance is provided as the bias element 133. On the other hand, constituting the bias element 133 by using a constant current source might cause difficulty in changing the bias current of the common-gate transistor 131, and this might hinder execution of gain control and signal interruption as expected. Therefore, the second embodiment assumes that a shunt transistor for shunting a current is provided in parallel with the common-gate transistor 131.

Note that the outline of the signal amplifier device is similar to that of the first embodiment, and thus description of the outline will be omitted.

Circuit Configuration

Figure 5:
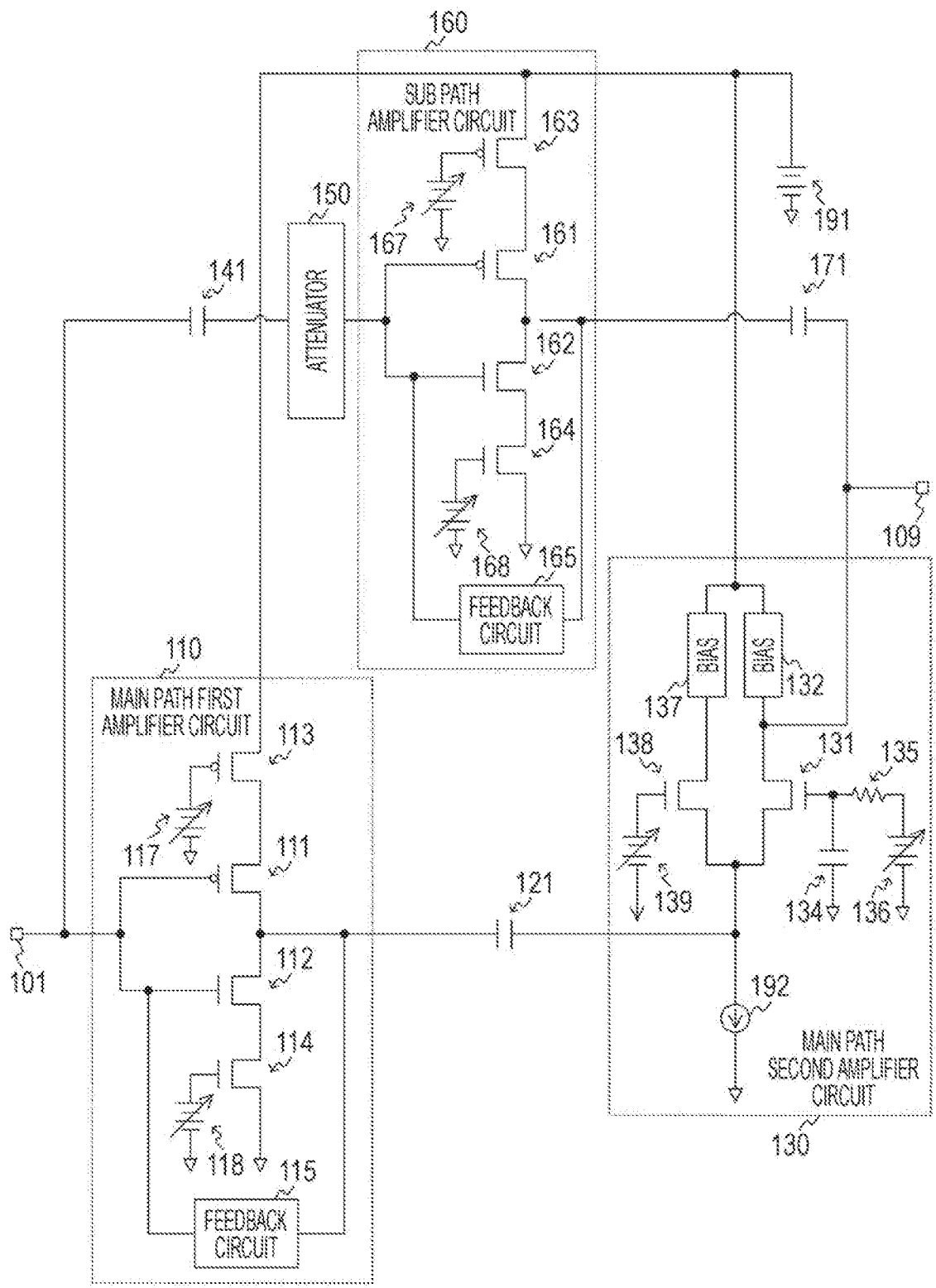
FIG. 5 is a diagram illustrating a circuit example of a signal amplifier device according to a second embodiment of the present technology.

FIG. 5 is a diagram illustrating a circuit example of a signal amplifier device according to the second embodiment of the present technology. The signal amplifier device according to the second embodiment includes a constant current source 192 as the bias element 133, and additionally, a bias element 137, a shunt transistor 138, and a variable power supply 139 are provided in parallel with the common-gate transistor 131. The other configurations are similar to those in the first embodiment described above.

The shunt transistor 138 is a transistor for shunting the current flowing through the common-gate transistor 131. The bias element 137 is a bias element on the power supply 191 side of the shunt transistor 138. The variable power supply 139 supplies a voltage to the gate of the shunt transistor 138 to control the bias current.

It is possible, in this circuit configuration, to control the gain of the common-gate transistor 131 by controlling the individual gate voltages so that the sum of the bias current of the common-gate transistor 131 and the bias current of the shunt transistor 138 becomes constant.

Gain Control

Figure 6:
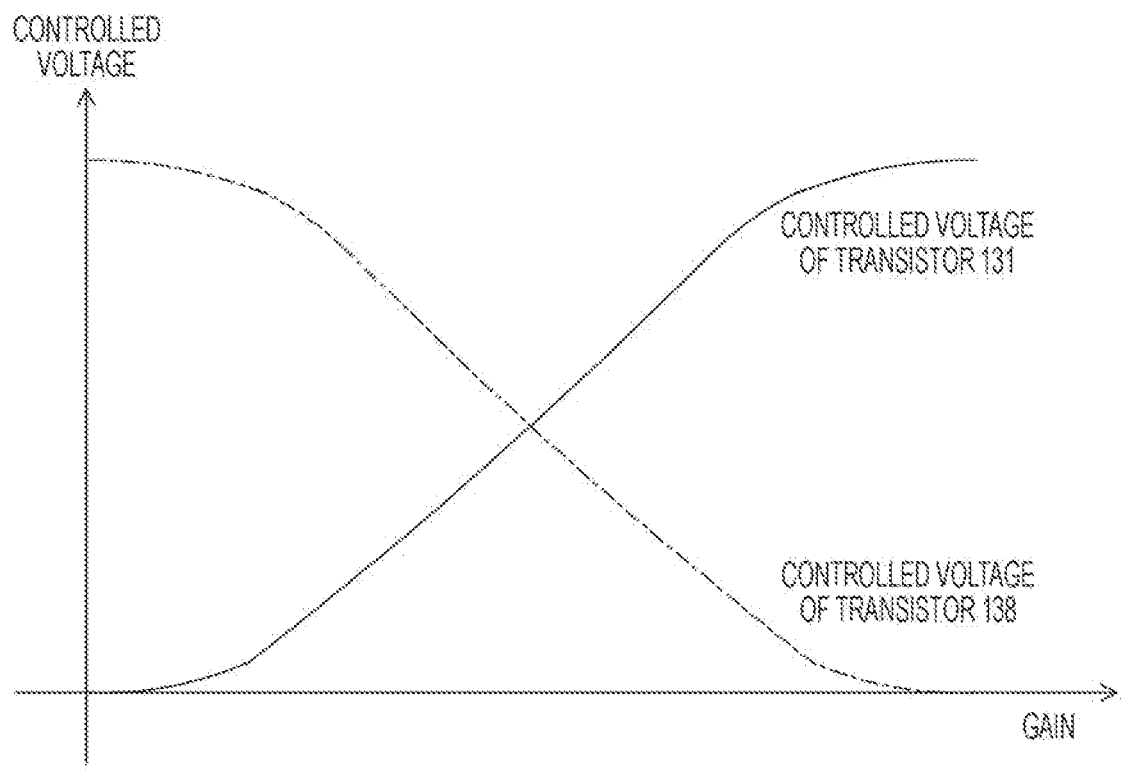
FIG. 6 is a diagram illustrating an example of gain control of the signal amplifier device according to the second embodiment of the present technology.
Figure 6:
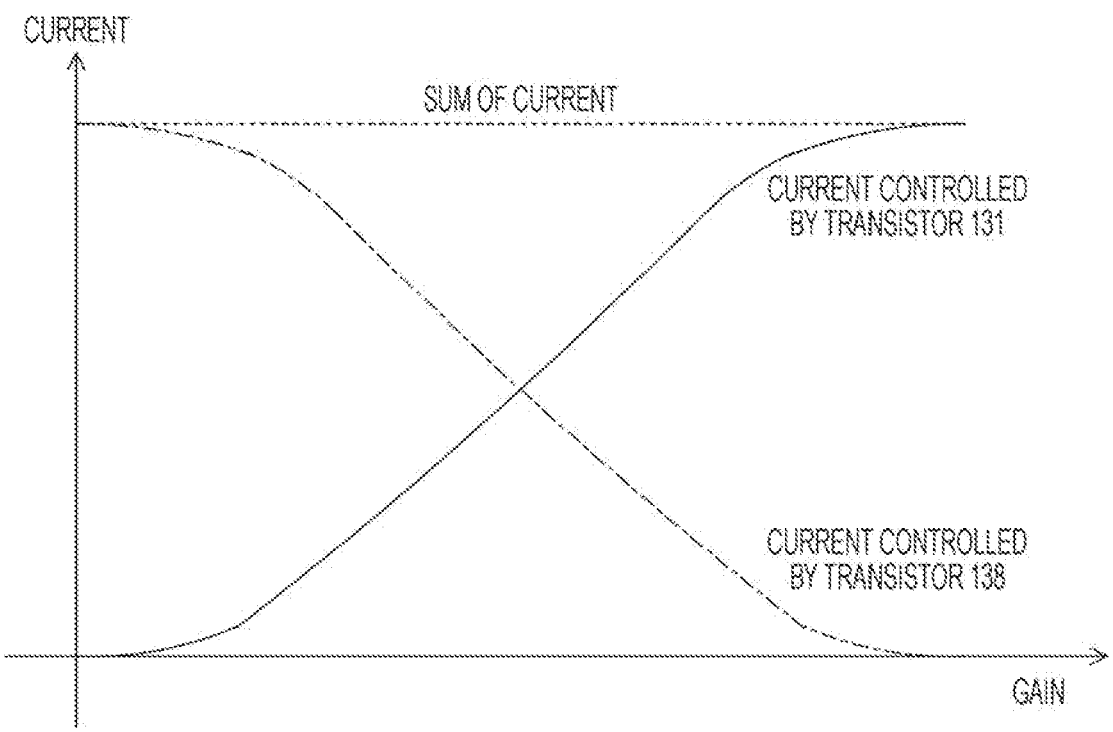

FIG. 6 is a diagram illustrating an example of gain control of the signal amplifier device according to the second embodiment of the present technology. The upper graph in the figure illustrates an example of the relationship between the gate voltage of each of the common-gate transistor 131 and the shunt transistor 138 and the gain. The lower graph in the figure illustrates an example of the relationship between the current flowing through each of the common-gate transistor 131 and the shunt transistor 138 and the gain. The solid line illustrates a graph of the common-gate transistor 131, and the one-dot chain line illustrates a graph of the shunt transistor 138.

As illustrated in this example, when the gate voltages of the common-gate transistor 131 and the shunt transistor 138 are changed so as to be inverted with each other, the currents flowing through the common-gate transistor 131 and the shunt transistor 138 also change so as to be inverted with each other. This control makes it possible to maintain the sum of the currents flowing through the common-gate transistor 131 and the shunt transistor 138 to be constant. On the assumption that such control is performed, it is possible to use the constant current source 192 having high impedance as the bias element 133.

In this manner, according to the second embodiment of the present technology, the constant current source 192 having high impedance is used as the bias element 133 to enable reduction of the signal loss, leading to improvement of the noise performance.

3. Third Embodiment

In the first and second embodiments described above, the main path first amplifier circuit 110 and the main path second amplifier circuit 130 are mutually connected by the capacitor 121 so as not to share a DC current between them. However, the size of the capacitor 121 would increase depending on the frequency in use, which might hinder the downsizing of the signal amplifier device. Therefore, a third embodiment includes a replica circuit of the main path second amplifier circuit 130 to provide feedback to the main path first amplifier circuit 110 so that the voltages of the corresponding terminals of both circuits are equalized so as to reduce the capacitor 121.

Note that the outline of the signal amplifier device is similar to that of the first embodiment, and thus description of the outline will be omitted.

Circuit Configuration

Figure 7:
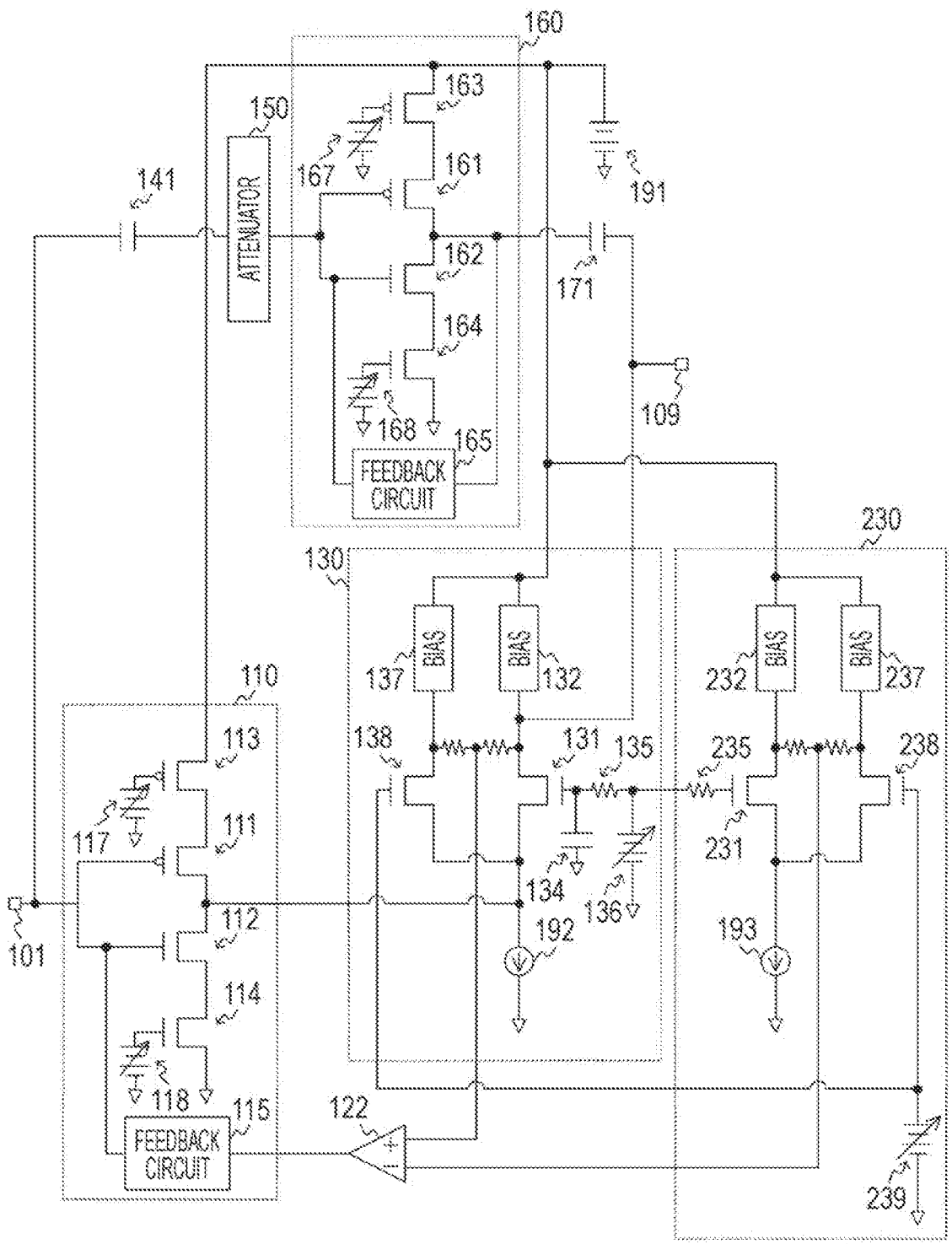
FIG. 7 is a diagram illustrating a circuit example of a signal amplifier device according to a third embodiment of the present technology.

FIG. 7 is a diagram illustrating a circuit example of a signal amplifier device according to the third embodiment of the present technology. The signal amplifier device according to the third embodiment includes a replica circuit 230 of the main path second amplifier circuit 130 and an operational amplifier 122 in place of the capacitor 121.

The replica circuit 230 includes a common-gate transistor 231, bias elements 232 and 237, a resistor 235, a constant current source 193, a shunt transistor 238, and a variable power supply 239, corresponding to individual portions in the main path second amplifier circuit 130. The common-gate transistor 231 shares a gate voltage with the common-gate transistor 131. Accordingly, when the drain voltage and the source voltage match between the main path second amplifier circuit 130 and the replica circuit 230, the bias currents of both the gates match the constant current source 192 or 193. This divides the common-gate transistor 131 and the common-gate transistor 231 in DC current connection.

Furthermore, since the sources of the main path second amplifier circuit 130 and the replica circuit 230 are biased by the constant current source 192 or 193, the source voltages automatically match when the drain voltages match. Therefore, feedback is provided to the gate of the common-source amplifier circuit of the main path first amplifier circuit 110 via the operational amplifier 122 so that the drain voltage of the common-gate transistor 131 and the drain voltage of the common-gate transistor 231 match with each other. This achieves match in the source voltages between the common-gate transistor 131 and the common-gate transistor 231. Therefore, since the gate voltages, the drain voltages, and the source voltages match between the common-gate transistors 131 and 231, the bias current of the main path second amplifier circuit 130 would not leak to the main path first amplifier circuit 110. Accordingly, the capacitor 121 is unnecessary between the main path first amplifier circuit 110 and the main path second amplifier circuit 130, making it possible to eliminate the capacitor 121.

In this manner, according to the third embodiment of the present technology, as a result of providing the replica circuit 230 and providing feedback to the main path first amplifier circuit 110 via the operational amplifier 122, it is possible to reduce the capacitor 121.

4. Modification

While each of the above-described embodiments describes an example in which two paths of one main path and one sub paths are connected in parallel, a plurality of main paths may be connected.

Figure 8:
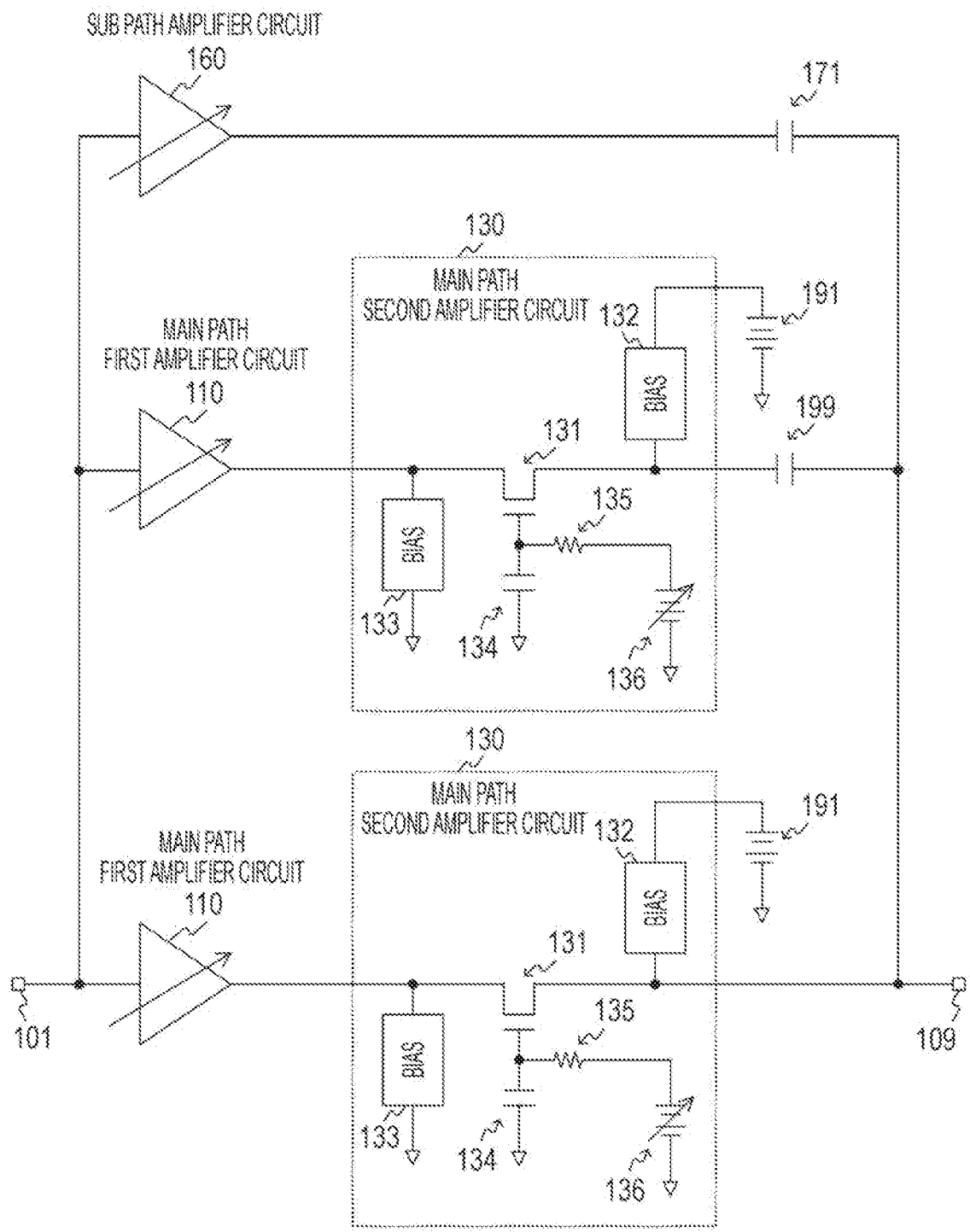
FIG. 8 is a diagram illustrating a schematic example of a signal amplifier device in a modification of the embodiment of the present technology.

FIG. 8 is a diagram illustrating a schematic example of a signal amplifier device in a modification of the embodiment of the present technology. In this modification, a plurality of main paths is connected with a sub path in parallel. Connecting the plurality of main paths in this manner enables controls of the gain of the signal amplifier device more finely and continuously.

Note that the above-described embodiment illustrates an example for embodying the present technology, and the matter of the embodiments corresponds to the subject matter of the invention included in the appended claims. Similarly, the subject matter of the invention included in the appended claims corresponds to the matter under the same names as the matter in the embodiments of the present technology. The present technology, however, is not limited to the embodiments, and various modifications can be made to the embodiments without departing from the scope of the technology.

Note that effects described here in the present specification are provided for purposes of exemplary illustration and are not intended to be limiting. Still other effects may also be contemplated.

Note that the present technology may also be configured as below.

(1) A signal amplifier device including:
a main path first amplifier circuit that amplifies an input signal on a main path;
a main path second amplifier circuit including a common-gate transistor connected in series to an output of the main path first amplifier circuit without sharing a DC current; and
a sub path amplifier circuit that amplifies, on a sub path connected in parallel to the main path, the input signal by using a gain lower than a maximum gain on the main path.

(2) The signal amplifier device according to (1),
in which phases of output voltages are the same in the main path first amplifier circuit, the main path second amplifier circuit, and the sub path amplifier circuit.

(3) The signal amplifier device according to (1) or (2),
in which the main path second amplifier circuit arranges a bias element that supplies a DC current to be connected to each of a source and a drain.

(4) The signal amplifier device according to (3),
in which the main path second amplifier circuit further includes a shunt transistor connected in parallel with the common-gate transistor so as to shunt a current, and
the bias element on the source side of the common-gate transistor is a constant current source.

(5) The signal amplifier device according to any of (1) to (3),
in which the main path second amplifier circuit changes a gate voltage of the common-gate transistor to control mutual conductance so as to perform gain control and signal interruption.

(6) The signal amplifier device according to any of (1) to (3),
in which the main path first amplifier circuit allows another transistor to be inserted to the source to control a gate voltage of the other transistor to control a resistance value of the other transistor so as to perform gain control.

(7) The signal amplifier device according to any of (1) to (3),
in which the sub path amplifier circuit allows another transistor to be inserted to the source to control a gate voltage of the other transistor to control a resistance value of the other transistor so as to perform gain control.

(8) The signal amplifier device according to any of (1) to (7),
further including a gain control bias circuit that is driven by a single variable power supply to perform gain control for each of the main path first amplifier circuit, the main path second amplifier circuit, and the sub path amplifier circuit.

(9) The signal amplifier device according to any of (1) to (8),
in which the sub path further includes an attenuator for attenuating a signal input to the sub path amplifier circuit.

(10) The signal amplifier device according to any of (1) to (9), further including:
a replica circuit having a same configuration as the configuration of the main path second amplifier circuit so as to share the gate voltage; and
an operational amplifier that provides feedback to the main path first amplifier circuit so as to achieve match in voltages of corresponding individual components between the main path second amplifier circuit and the replica circuit.

REFERENCE SIGNS LIST

101 Input terminal
109 Output terminal
110 Main path first amplifier circuit
111, 113, 161, 163 P-type transistor
112, 114, 162, 164 N-type transistor
115, 165 Feedback circuit
117, 118, 136, 139, 167, 168, 181, 239 Variable power supply
121, 134, 141, 171, 199 Capacitor
122 Operational amplifier
130 Main path second amplifier circuit
131, 231 Common-gate transistor
132, 133, 137, 232, 237 Bias element
135, 235 Resistor
138, 238 Shunt transistor
150 Attenuator
160 Sub path amplifier circuit
180 Gain control bias circuit
191 Power supply
192, 193 Constant current source
230 Replica circuit

The invention claimed is:
1. A signal amplifier device, comprising:
a main path first amplifier circuit configured to amplify an input signal on a main path;
a main path second amplifier circuit that includes:
a first common-gate transistor connected in series to an output of the main path first amplifier circuit without a direct current being shared between the main path first amplifier circuit and the main path second amplifier circuit;

a first bias element configured to supply a first direct current to a source of the first common-gate transistor, wherein the first bias element is a constant current source; and a second bias element configured to supply a second direct current to a drain of the first common-gate transistor; and a sub path amplifier circuit configured to amplify, on a sub path connected in parallel to the main path, the input signal based on a gain lower than a maximum gain on the main path.

2. The signal amplifier device according to claim 1, wherein output voltages of the main path first amplifier circuit, the main path second amplifier circuit, and the sub path amplifier circuit have the same phase.

3. The signal amplifier device according to claim 1, wherein
the main path second amplifier circuit further includes a shunt transistor connected in parallel with the first common-gate transistor, and
the shunt transistor is configured to shunt a specific current.

4. The signal amplifier device according to claim 1, wherein the main path second amplifier circuit is configured to:
change a gate voltage of the first common-gate transistor to control mutual conductance of the first common-gate transistor; and
execute gain control and signal interruption based on the change in the gate voltage.

5. The signal amplifier device according to claim 1, wherein
the main path first amplifier circuit includes:
a first transistor;
a second transistor connected to a source of the first transistor; and
a variable power supply connected to a gate of the second transistor, and the main path first amplifier circuit is further configured to:
control, by the variable power supply, a gate voltage of the second transistor;
control a resistance value of the second transistor, based on the control of the gate voltage of the second transistor; and
execute gain control based on the control of the resistance value.

6. The signal amplifier device according to claim 1, wherein
the sub path amplifier circuit includes:
a first transistor;
a second transistor connected to a source of the first transistor; and
a variable power supply connected to a gate of the second transistor, and the sub path amplifier circuit is further configured to:
control, by the variable power supply, a gate voltage of the second transistor;
control a resistance value of the second transistor based on the control of the gate voltage of the second transistor; and
execute gain control based on the control of the resistance value.

7. The signal amplifier device according to claim 1, further comprising a gain control bias circuit configured to execute, by a single variable power supply, gain control for each of the main path first amplifier circuit, the main path second amplifier circuit, and the sub path amplifier circuit.

8. The signal amplifier device according to claim 1, wherein
the sub path amplifier circuit includes an attenuator on the sub path, and
the attenuator is configured to attenuate the input signal input to the sub path amplifier circuit.

9. The signal amplifier device according to claim 1, further comprising:
a replica circuit that includes a second common-gate transistor corresponding to the first common-gate transistor of the main path second amplifier circuit, wherein the replica circuit is configured to share a gate voltage of the main path second amplifier circuit; and
an operational amplifier configured to output feedback to the main path first amplifier circuit, wherein the feedback is output to match a voltage of the first common-gate transistor of the main path second amplifier circuit with the second common-gate transistor of the replica circuit.

* * * * *